United States Patent
Wolterink et al.

(10) Patent No.: US 12,547,077 B2
(45) Date of Patent: Feb. 10, 2026

(54) PRINTING PLATE EXPOSURE METHOD AND APPARATUS WITH REDUCED THERMAL POLYMERIZATION

(71) Applicant: Esko-Graphics Imaging GmbH, Itzehoe (DE)

(72) Inventors: Jörg Wolterink, Oelixdorf (DE); Thomas Hänsel, Elmshorn (DE); Christian Greve, Itzehoe (DE); Frank Grewling, Breitenberg (DE); Karsten Stubbe-Thierer, Berlin (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 181 days.

(21) Appl. No.: 18/275,276

(22) PCT Filed: Dec. 30, 2021

(86) PCT No.: PCT/EP2021/087830
§ 371 (c)(1),
(2) Date: Aug. 1, 2023

(87) PCT Pub. No.: WO2022/161733
PCT Pub. Date: Aug. 4, 2022

(65) Prior Publication Data
US 2024/0118624 A1    Apr. 11, 2024

Related U.S. Application Data

(60) Provisional application No. 63/144,123, filed on Feb. 1, 2021.

(51) Int. Cl.
G03F 7/20    (2006.01)
G03F 7/00    (2006.01)
G03F 7/038   (2006.01)

(52) U.S. Cl.
CPC ............ *G03F 7/2055* (2013.01); *G03F 7/038* (2013.01); *G03F 7/2041* (2013.01);
(Continued)

(58) Field of Classification Search
CPC ........................................................ G03F 7/20
See application file for complete search history.

(56) References Cited

U.S. PATENT DOCUMENTS 5,983,800 A     11/1999  Barral et al.
2016/0229173 A1*  8/2016  Boyksen .............. G03F 7/2016

FOREIGN PATENT DOCUMENTS

WO    2017158943 A1    9/2017

OTHER PUBLICATIONS

International Preliminary Report on Patentability for International Application No. PCT/EP2021/087830, dated Jul. 31, 2023, 7 pages.
(Continued)

*Primary Examiner* — Chanceity N Robinson
(74) *Attorney, Agent, or Firm* — Buchanan Ingersoll & Rooney PC (57) ABSTRACT

Systems and methods for curing a photopolymer printing plates. A radiation source, such as an UV LED source having a radiation-emitting lateral dimension in a range 10-60 cm, is spaced from a substrate that holds the printing plate. The source and substrate are configured to move relative to one another in a movement direction that defines a leading edge of the radiation source and a trailing edge of the radiation source. A cooling air handling system directs a volume of cooling air into the gap between the radiation source and the printing plate in a direction from the trailing edge to the leading edge. The cooling air handling system may have one or more outlets attached at least one edge of the source, may be configured to only direct air from the trailing edge to the leading edge, or a combination thereof.

18 Claims, 7 Drawing Sheets

(52) U.S. Cl.
CPC ........ *G03F 7/2047* (2013.01); *G03F 7/70733* (2013.01); *G03F 7/70858* (2013.01)

(56) References Cited

OTHER PUBLICATIONS

International Search Report and Written Opinion for International Application No. PCT/EP2021/087830, dated May 9, 2022, 9 pages.

* cited by examiner

PRINTING PLATE EXPOSURE METHOD AND APPARATUS WITH REDUCED THERMAL POLYMERIZATION

CROSS-REFERENCE TO RELATED APPLICATIONS

This application is a U.S. National Phase Patent Application of PCT Patent Application No. PCT/EP2021/087830, filed Dec. 30, 2021, which is related to and claims priority from U.S. Provisional Application Ser. No. 63/144,123, filed Feb. 1, 2021, titled PRINTING PLATE EXPOSURE METHOD AND APPARATUS WITH REDUCED THERMAL POLYMERIZATION, the contents of both of which are incorporated herein by reference in their entireties for all purposes.

BACKGROUND OF THE INVENTION

In the field of curing flexographic polymer printing plates, it is generally known to apply cooling to the photopolymer to avoid excessive warming of the polymer by the energy of the curing light, referred to herein as "actinic radiation," such as radiation in the ultraviolet (UV) range. Plate makers generally try to avoid excess warming of the polymer to avoid unwanted additional thermal polymerisation, which may broaden certain small features in the printing plate and/or may distort the targeted tone curves in the print.

Known plate cooling systems and methods are described in U.S. Pat. No. 5,983,800 and are embodied in prior art exposure units, such as UV tube exposure unit DuPont® Cyrel® model 2000 ECLF. In the DuPont unit, the plate is disposed on a water-cooled support bed while UV radiation is produced by fluorescent tubes.

Light emitting diode (LED) exposure units also use cooling. The Nyoflex® NExT exposure system, made by Flint Group, has an air blade that blows air from the leading edge of the exposure head onto the polymer. As used herein, the term "leading edge" refers to the edge of the exposure head that lies in the direction of travel between the source and the plate, and "trailing edge" refers to the edge that lies opposite the direction of travel. Likewise, the Xeikon® Catena® system creates air flushing from one end of the flatbed (on which the plate is disposed) to the other in a fixed direction from a stationary position that does not change with the direction of UV head travel. Therefore, the cooling air flows from leading edge to trailing edge when the head moving in the "forward" direction in which it is known to irradiate the plate. Typically, a UV head in such a system does not irradiate the plate during movement in a reverse direction to reset to the beginning of the forward travel, because otherwise, the timing sequence of the exposure steps would be different for the center of the plate versus the beginning and ending edges.

Applicant has found no mention in the prior art of any particular advantages of the arrangement of the air stream relative to the direction of the movement.

SUMMARY OF THE INVENTION

One aspect of the invention relates to a system for curing a photopolymer printing plates curable by exposure to actinic radiation. The system comprises a substrate for receiving the photopolymer printing plate, a source of actinic radiation spaced from the substrate, means for providing relative motion between the source and the substrate in a movement direction that defines a leading edge of the source and a trailing edge of the source, and a cooling air handling system configured to direct a volume of cooling air into the gap between the radiation source and the printing plate only in a direction from the trailing edge to the leading edge. The volume of moving cooling air may be controllable. The source of actinic radiation may include one or more UV LED sources, such as wherein the one or more UV LED sources comprises an array of UV LED point sources. The one or more UV LED sources may have a radiation-emitting lateral dimension in the movement direction in a range 10-60 cm. In some embodiments, the cooling air handling system may have an outlet attached to the radiation source, which outlet may be configured to direct the volume of moving cooling air at an angle of less than 45 degrees relative to a planar surface defined by the printing plate. In other embodiments, the cooling air handling system may also include one or more air outlets fixed at one end or both ends of the substrate. In such embodiments, the cooling air may be contained between the substrate and a cover, or contained between the substrate and a foil having one end attached to a trailing edge of the source and the other end disposed on a roller disposed adjacent the air outlet.

In some embodiments, the air handling system comprises one or more fans, and the speed of the one or more fans may be controllable. The one or more fans may have an air intake, with an air filter is disposed in the air intake. In embodiments, the one or more fans are disposed adjacent a trailing edge of the source of actinic radiation. In other embodiments, the air handling system includes a duct connected to a manifold disposed to direct the moving cooling air into the gap. In some embodiments, the air handling system is connected to a source of compressed air for generating the volume of cooling air, and some systems may include an air compressor as the source of compressed air. The air handling system may include a heat exchanger configured to reduce temperature of the airflow, such as a water-cooled heat exchanger having a source of water connected to the heat exchanger, such as a same source of water that feeds a cooling system for cooling the radiation source.

The system may include a controller configured to control the relative motion between the source of actinic radiation and the substrate, in which the system is configured to emit actinic radiation in a first relative movement direction and in a second relative movement direction opposite the first relative movement direction. In such embodiments, the controller may be configured to change the direction of the moving cooling air in coordination with the movement direction so that the cooling air travels from the trailing edge to the leading edge in both the first movement direction and the second movement direction. In some embodiments in which the air handling system comprises a first set of one or more fans positioned to discharge air from a first side of the radiation source and second set of one or more fans positioned to discharge air from a second side of the radiation source, the controller may be configured to activate the first set of fans and deactivate the second set of fans when the trailing edge is on the first side and to activate the second set of fans and deactivate the first set of fans when the trailing edge is on the second side. In other embodiments in which the air handling system comprises a single set of one or more fans connected to a duct connected to a manifold disposed to direct the moving cooling air, the controller may be configured to control a rotation direction of the single set of one or more fans so that the manifold serves as either a discharge of air or an intake of air based upon the movement direction, so that the cooling air travels from the trailing edge to the leading edge in both the first movement direction and the second movement direction. In still other embodiments in which the air handling system comprises a first manifold positioned to discharge air from a first side of the radiation source and a second manifold positioned to discharge air from a second side of the radiation source, a valve disposed in the duct upstream of the first manifold and the second manifold may have a first position in which air flows only to the first manifold and a second position in which air flows only to the second manifold, with the controller configured to cause the valve to be in the first position when the trailing edge is on the first side and to cause the valve to be in the second position when the trailing edge is on the second side.

Another aspect of the invention relates to a method for curing a printing plate comprising a photopolymer curable by exposure to actinic radiation. The method includes the steps of disposing the printing plate in a location spaced by a defined gap from a source of actinic radiation, emitting radiation from the source of actinic radiation while causing relative movement between the source of actinic radiation and the plate in a movement direction that defines a leading edge of the source and a trailing edge of the source relative to the movement direction; and directing a volume of moving cooling air in the gap, wherein the air travels only from the trailing edge to the leading edge. The method may include emitting the radiation from the source in a first relative movement direction and in a second relative movement direction opposite the first relative movement direction, and changing direction of the moving cooling air in coordination with the movement direction so that the cooling air travels from the trailing edge to the leading edge during relative movement in both the first relative movement direction and the second relative movement direction. The method may include adjusting the volume of moving cooling air based upon curing conditions, reducing a temperature of the cooling air below an ambient temperature, providing the volume of moving cooling air in a turbulent airflow regime, filtering the cooling air, or combinations and permutations of any of the foregoing. The method may include directing the air from an air outlet attached to the source, and particularly at an angle of 45 degrees relative to the plane of the printing plate. The method may also include directing the air from one or more air outlets fixed at one end or both ends of the substrate.

Another aspect of the invention relates to a system for curing a photopolymer printing plate curable by exposure to actinic radiation. The system includes a substrate for receiving the photopolymer printing plate and a source of actinic radiation spaced from the substrate a distance sufficient to define a gap between the radiation source and the printing plate disposed on the substrate, the source operable to direct actinic radiation toward the substrate. A means for providing relative motion causes such relative motion between the source and the substrate in a movement direction that defines a leading edge of the source and a trailing edge of the source relative to the movement direction; and a cooling air handling system having an outlet attached to the radiation source is configured to direct a volume of cooling air into the gap with the cooling air moving in a direction from the trailing edge to the leading edge.

Another aspect of the invention relates to a method for curing a printing plate comprising a photopolymer curable by exposure to actinic radiation. The method includes the steps of disposing the printing plate in a location spaced by a defined gap from a source of actinic radiation; emitting radiation from the source of actinic radiation while causing relative movement between the source of actinic radiation and the plate in a movement direction that defines a leading edge of the source and a trailing edge of the source relative to the movement direction; and directing a volume of moving cooling air into the gap traveling from the trailing edge to the leading edge from a cooling air outlet affixed to the radiation source.

DETAILED DESCRIPTION OF THE INVENTION

Applicant has studied the effect of air cooling on curing of photopolymer printing plates, and has surprisingly found a performance advantage when cooling air is directed only from the trailing side of the radiation source into the gap between the polymer plate and the source. Applicant has thus discovered a method and apparatus for improved cooling of photopolymer plates during UV exposure. In embodiments, the UV light sources may be UV LEDs, the photopolymer plate may be a digital plate having a laser ablateable mask (LAMs) layer, and the array of UV LEDs may have a significant lateral dimension in direction of the relative movement. Cooling is applied by blowing cooling air into a gap between the radiation source and the polymer plate from the trailing edge of the radiation source.

Polymer Cooling Theory

In experiments with air flushing during UV exposure of polymer printing plates on the a commercial exposure unit (i.e. an Esko® XPS Crystal™ exposure unit), the inventors discovered that the curing result was improved when the air stream was directed from the trailing edge toward the leading edge of the moving radiation source.

Without being tied to any particular theory, it is believed that the claimed arrangement provides the highest cooling efficiency for the photopolymer. The moving radiation source (e.g. a UV LED exposure head) heats the polymer underneath the source during relative movement. Any point on the polymer plate located under the UV head increases in temperature while the motion progresses. When the leading edge of the UV head is aligned with an underlying area of the polymer, the temperature is still close to ambient temperature, but when the trailing edge of the UV head passes the same area, the temperature has reached a maximum. The absolute temperature of this maximum depends on the ambient/starting temperature, UV irradiance, speed of the UV head, and optical length of the head.

Figure 1A:
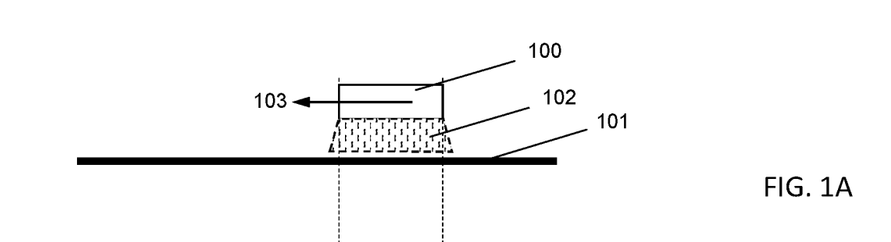
FIG. 1A is a schematic side view drawing depicting an exemplary radiation source relative to a printing plate in a curing operation.
Figure 1B:
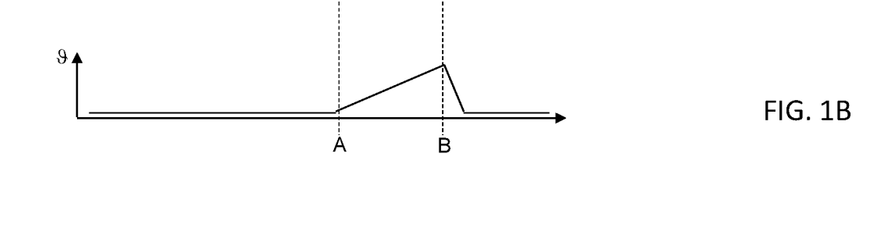
FIG. 1B is a graph, aligned with the features of FIG. 1A, of temperature of the printing plate polymer as a function of position of the plate, when being cured.

This physical arrangement of a typical prior art arrangement showing a radiation source (e.g. a UV head) is depicted in FIG. 1A, and the corresponding graph of temperature in the polymer is depicted in FIG. 1B in alignment with the physical arrangement. In FIG. 1B the temperature 9 of the polymer plate 101 at different locations are visualized at a given time. All portions of the polymer not underneath the UV head 100 and exposed to radiation 102 are at ambient temperature. At point "A" on the graph, the UV head 100, moving in the direction of the arrow 103, has just started to irradiate the polymer. The temperature at point A is therefore just starting to rise above the ambient temperature. At point B, which has been completely irradiated by the UV head over the full extent of travel, the temperature has reached a maximum and starts to decay back to ambient temperature again.

Temperatures above a certain threshold temperature can cause thermal polymerization in addition to the UV polymerization. As a result of this additional polymerization, small dots on the plate grow bigger than without thermal polymerization. Under certain conditions, thermal polymerization can cause the so-called "line broadening effect," in which lines in the polymer printing plate tend to print wider than is desired.

As temperature increases, the likelihood of thermal polymerization also increases. Accordingly, it is most efficient for prevention of thermal polymerization to avoid or reduce the temperature peak at point B. Moreover, at B, the temperature difference between polymer and surrounding air is at a maximum, making air cooling from the trailing edge side of the UV head more efficient in comparison to cooling from the leading edge side. When blown from the leading edge side, the air warms up during travel from point A to B, causing the temperature difference between air and polymer to be lower at point B. Thus, in general, air cooling traveling from trailing edge to leading edge tends to flatten the spike in the curve depicted in FIG. 1B.

Although other cooling methods can be applied, air cooling is most efficient because it directly takes effect on the plate surface, and a significant portion of the temperature increase is introduced by the imaged mask on top of the polymer sheet. Although state of the art photopolymer plates are digital plates having a LAMs layer, the mask may be a film or a LAMs layer. Both types of masks are opaque and absorb the UV curing radiation, meaning that most of the radiation that hits the mask is converted into thermal energy, which due to the direct contact between mask and polymer, is transferred into the polymer. Therefore, air cooling provided above the LAMs Layer is more efficient compared to, e.g., a water-cooled bed underneath the plate.

The configuration depicted in FIG. 1A shows a UV light source having a significant lateral dimension in the direction of the relative movement 103 between the plate and the UV head. In arrangements in which the LEDs oriented in the direction of relative movement are concentrated in a relatively small line (e.g. having a lateral dimension of only 1-5 cm in the direction of movement), the side from which the cooling air is applied has a lesser impact than in UV heads having a significant lateral dimension in the direction of movement (e.g. in a range of 10-60 cm), the direction of air flow becomes particularly important to optimize the cooling effect.

In the arrangements shown and described herein, the cooling air is applied into the gap between UV head and photopolymer plate at the side of the UV head that is at the trailing edge of the UV head. Ideally, the air volume is adjustable to optimize the curing results. Various embodiments are possible.

Figure 2:
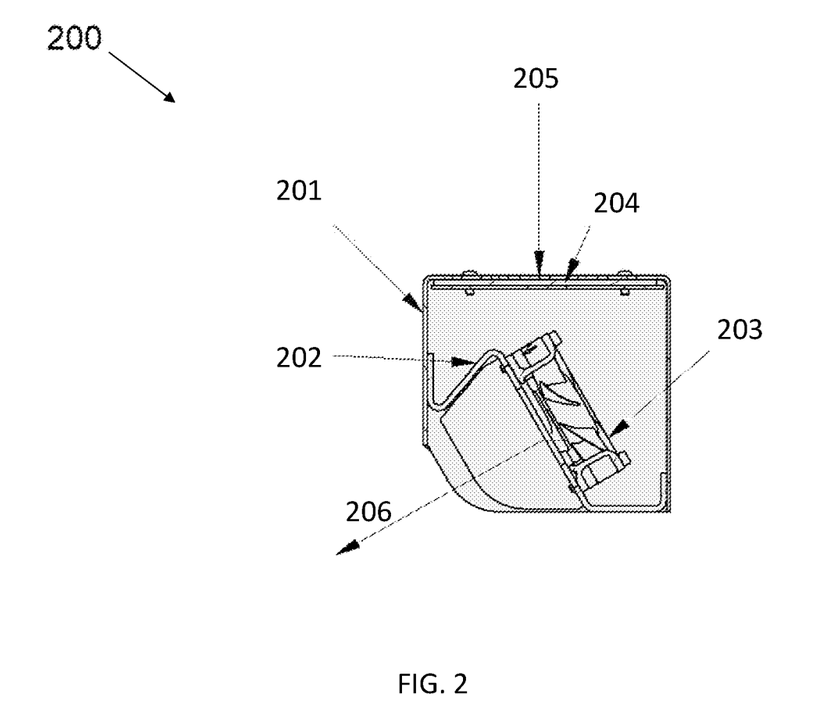
FIG. 2 is a cross-sectional view of an exemplary air handler for use in an embodiment of the invention.
Figure 3A:
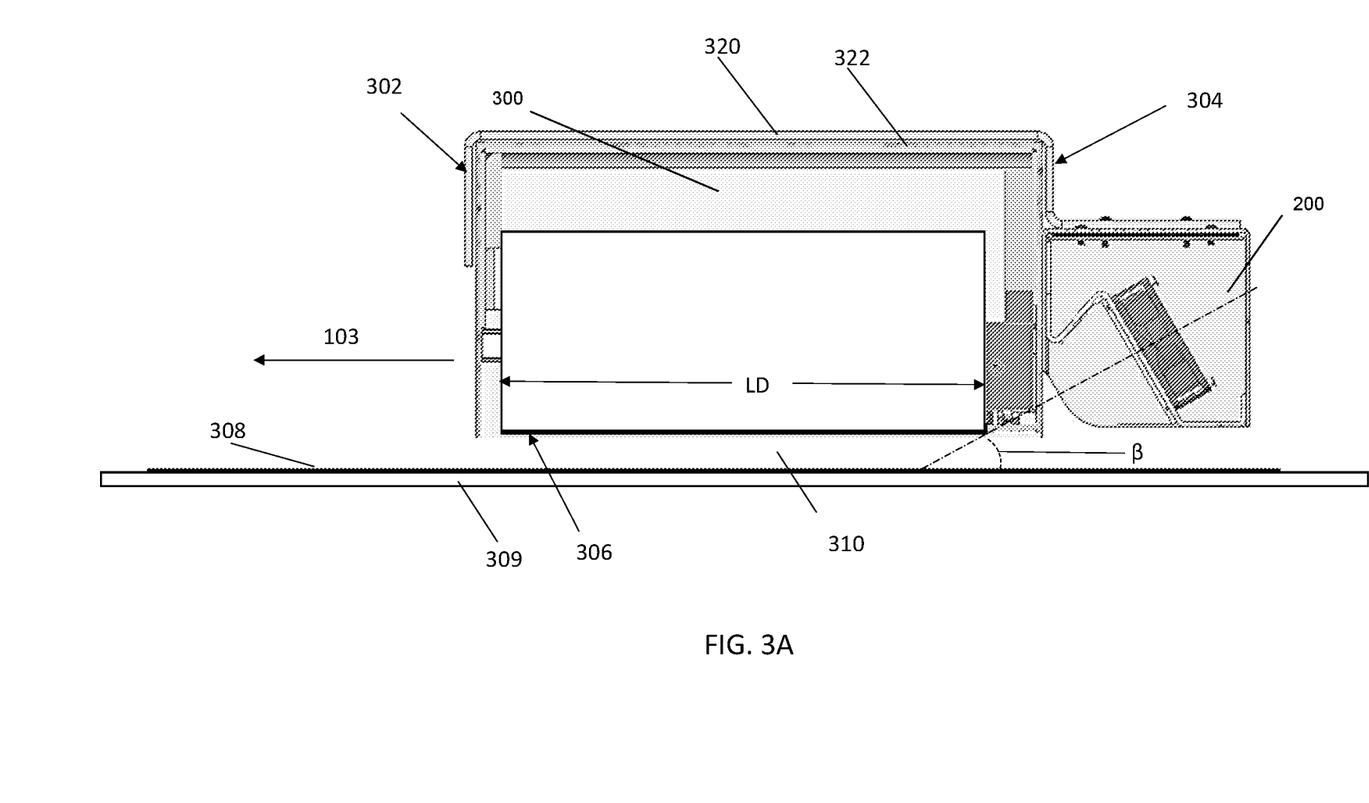
FIG. 3A is a cross-sectional view of the exemplary air handler of FIG. 2 positioned adjacent a radiation source in motion.
Figure 3B:
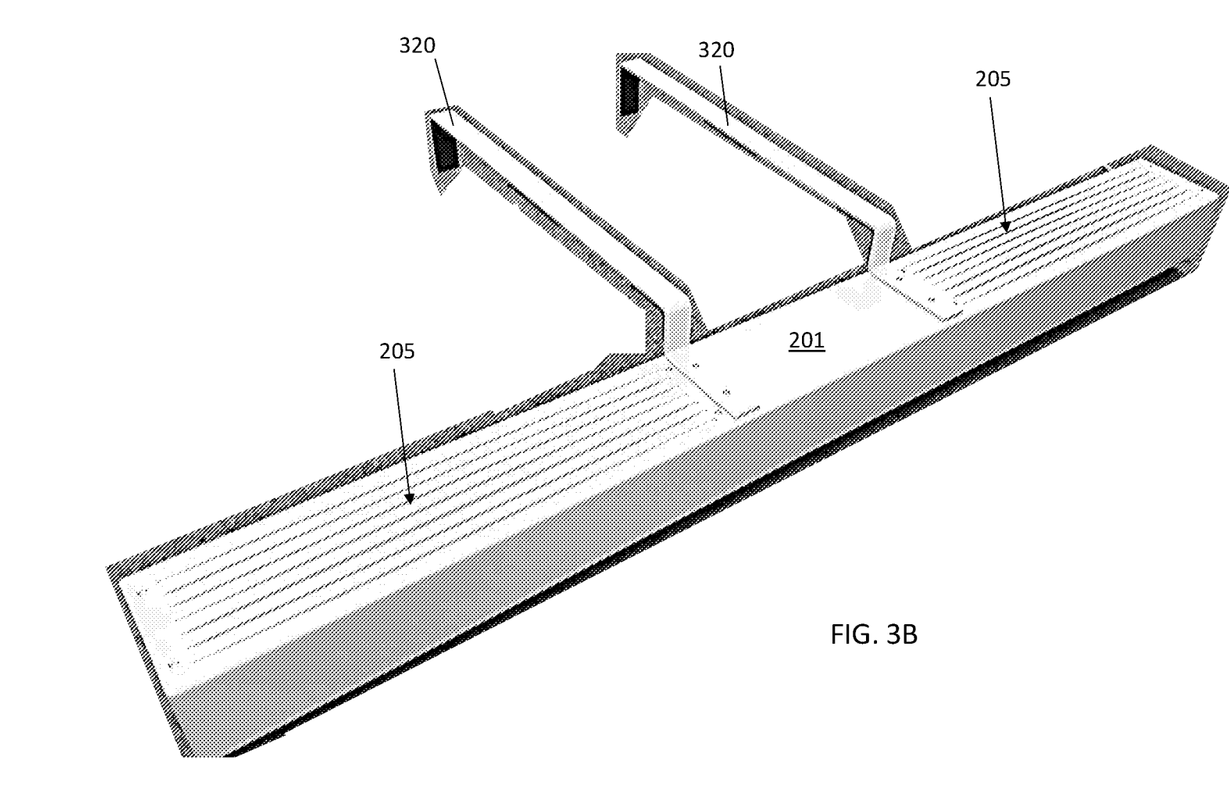
FIG. 3B is a perspective view photograph of the main cover of the air handler of FIG. 2 connected to exemplary mounting brackets for securing the air handler to the radiation source.

In a simple embodiment, depicted in FIG. 3A, an air handler 200, comprising a row of one or more fans, is arranged along the trailing edge 304 of the UV head 300. Although not limited to any particular construction, the main cover 201 of the air handler 300 may be mounted to one or more mounting brackets 320 affixed to a housing 322 of the UV head. The configuration of the main cover 201 and mounting brackets 320 are shown in more detail in FIG. 3B. The general construction and internals of UV head 300 (and other radiation sources relevant to the invention) are well known in the art, and not discussed in detail herein. FIG. 2 shows a cross-sectional view of air handler 200 equipped with fans 203. Inside a main cover 201, the fans 203 are mounted on a fan carrier plate 202. As depicted in FIG. 2, the air intake 205 of fan 200 has a particle filter 204 to filter out dust particles from the cooling air, which particles might otherwise stick on the polymer surface and affect the curing process. The fans are arranged at an angle β of less than 45° relative to the plane defined by the plate surface, with the air outlet 206 pointing towards the gap 310 between the surface 306 of the UV source 308 and the polymer plate 308 disposed on substrate 309. As depicted in FIG. 2, each fan 203 is mounted on a carrier plate 202, and a cover 201 surrounds the fan, except for at the intake 205 and at the outlet 206.

The volume of air flow also has a potential impact on performance. If the air volume is too high, this can have negative impact on the dimension stability of the LAMs layer. In particular, shrinkage of small mask openings has been observed when too much cooling air flow is provided. Such shrinkage may reduce the spot size of the printing dots in an unwanted way. Accordingly, embodiments with variable air flow control are preferred, to be able to optimize the air flow for particular conditions.

Figures 5, 6A, 6B, 6C:
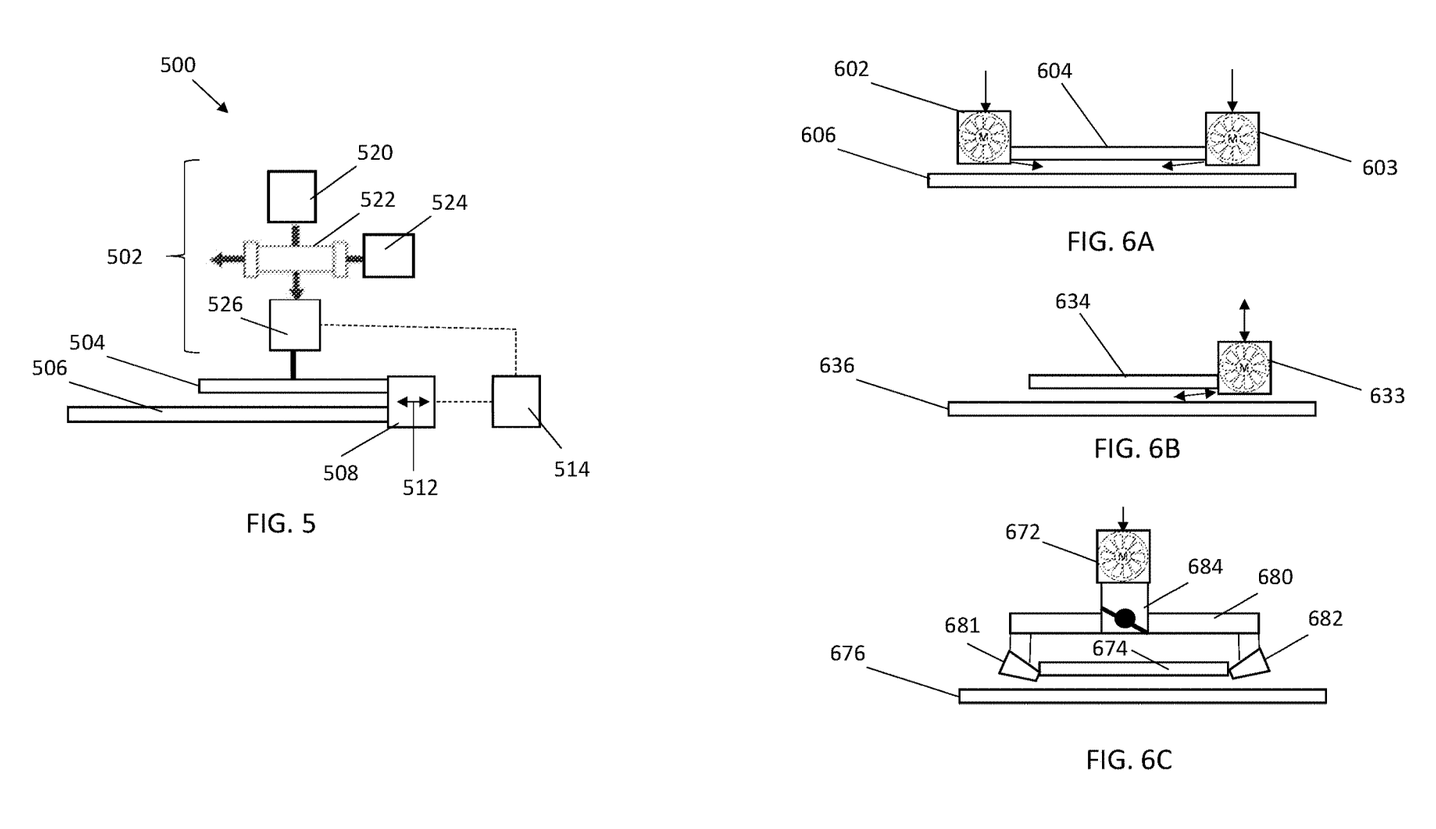
FIG. 5 is a schematic drawing of an exemplary system in accordance with one embodiment of the invention.
FIG. 6A is a schematic drawing of a portion of an embodiment with two fans for providing cooling air for a system configured to provide curing radiation in both directions of relative travel between the plate and the source.
FIG. 6B is a schematic drawing of a portion of a first embodiment with a single fan for providing cooling air for a system configured to provide curing radiation in both directions of relative travel between the plate and the source.
FIG. 6C is a schematic drawing of a portion of a second embodiment with a single fan for providing cooling air for a system configured to provide curing radiation in both directions of relative travel between the plate and the source.

The general arrangement of an exemplary system 500 is depicted in FIG. 5. Cooling air handling system 502 is connected to source 504, which is positioned above plate 506. Relative movement system 508 is configured to move source 504 relative to plate 506 in the directions of arrow 512. Cooling air system comprises air source 520, optional heat exchanger 522 (which is connected to a coolant source 524), and optional airflow directional control element 526, which controls the direction of cooling air flow relative to the source. In embodiments, direction control element 526 may also be configured to control the amount of cooling air (e.g. a set of one or more valves that can divert and/or regulate airflow). Controller 514 is configured to control at least the relative movement system 508, and in some embodiments, certain aspects of the cooling air handling system 502. Air source as depicted in FIG. 5 is intended to refer to any of the sources as described herein and air handling system, generally, is intended to refer to any of the configurations as described and depicted herein, including but not limited to those in FIGS. 6A-6C. In particular, airflow directional control element 526 and controller 514 are intended to represent all of the configurations described below with respect to FIGS. 6A-6C, without limitation, as well as to any configuration that enables a controller and air handler combination to supply air from one edge of the radiation source during travel in one direction, and from the opposite edge during travel in the opposite direction. Controller 514 may also control the rate of airflow by any mechanism known in the art, such as by controlling fan or compressor speed in systems in which the air handler is dedicated to the exposure unit, or by controlling a flow control valve, such as may be more practical in systems with an air source that is not dedicated to the exposure unit.

Heat exchanger 522 may comprise a water-to-air heat exchanger, in which coolant source 524 is water, thereby providing lower air temperature and making the air cooling more efficient and less dependent on ambient temperature. The water supply for the heat exchanger may be the same as for the cooling of the UV LEDs or otherwise may be independent from LED cooling water. A heat exchanger may be present in any of the configurations discussed herein, placed somewhere in the air stream between the intake of the air handling system and the gap between the polymer plate and the UV head.

Although primarily depicted herein with the use of fans as the source of air, the invention is not limited to any particular source of cooling air. For example, in some embodiments, the cooling air may be provided by an air compressor. The air compressor may be a part of the dedicated air cooling system for the exposure unit, or may be a compressor that supplied "tool air" to all or a part of a manufacturing facility. The output of the air compressor may flow through one or more filters and/or driers (e.g. a dessicant) to remove unwanted particles and moisture, including one or more filters/driers for the entire tool air system and/or one or more filters/driers dedicated to the exposure unit (or bank of exposure units).

In some embodiments, such as depicted in FIG. 6C, the air may be accelerated by a single blower 672 and guided and distributed by a duct system 680 leading to a manifold 682 configured to discharge air in the gap between the polymer plate 676 and the source 674. While the cross section of the manifold inlet is equivalent to the exit cross section of the blower, the exit section of the manifold may be a narrow slit arranged parallel to the gap between the UV head and the polymer plate.

In some embodiments, such as is depicted in FIG. 6A, the radiation source 604 may be configured to emit actinic radiation in both directions of travel relative to the plate 606, if desired. In such embodiments, one air handler (e.g. fan or set of fans 602, 603) may be mounted on each side of the head. The air handlers may then be turned on and off according to the direction of movement of the radiation source.

In another embodiment in which the radiation source is operated in both directions, depicted in FIG. 6B, a single air handler 633 is mounted to the head, and the direction of the airflow inverted according to the direction of movement of the UV head, such that, for example, a fan blows air into the gap in one direction, and pulls air from the gap in the other.

In still other embodiments, such as that depicted in FIG. 6C, in which the UV head is operated in both directions with a single air handler 672, the air handler may discharge the air into a duct 680, with a diverter valve 684 located between the air handler and manifolds 681, 682 disposed on opposite sides of the head, such that the air handler can operate a single rotation direction, and the diverter valve causes the air to flow from one manifold or the other, depending upon movement direction of the source.

As known from fluid dynamics a turbulent air stream will cool more efficiently than a laminar stream, and therefore the air handling systems may be configured to ensure a turbulent airflow regime for the geometry (e.g. the effective diameter of the outlet may be sized so that even at lowest airflow rates, the airflow is in a turbulent regime). In some embodiments, the effective diameter may be variable and controllable by the controller in a manner synchronized to the expected or measured flowrate (e.g. based upon power supplied to the fans or valve percentage opening downstream of the air source for systems characterized with appropriate curves of airflow versus such variables). For example, one or more features, such as a damper or protrusions that impede a variable portion of the airstream at or near the outlet (not shown) as are generally known in the art, may reduce the effective area of the outlet in a controlled manner.

The systems and methods as described herein are applicable to flatbed systems having a moving radiation source and a stationary plate, as well as to systems where the radiation source is stationary and the substrate on which the plate is mounted moves. The method and all principles described herein are also applicable to drum exposure units, wherein the plate is mounted to a moving drum, and the radiation source is stationary. Thus, as depicted in FIG. 5, relative movement system 508 is intended to represent any of the foregoing types of systems known in the art for creating relative movement between a radiation source and a printing plate for curing the plate. The mechanisms for causing such motion, and controllers 514 for controlling the same, are well known in the art and not detailed further herein.

Cooling from the trailing edge during curing may have other benefits and advantages when implement in a plate making workflow, and the invention is not limited to any particular result, such as minimizing the adverse impacts of thermal polymerization.

The radiation source may be any source known in the art, but may have particular advantages when used in connection with UV LED sources, such as an array of one or more UV LED point sources, which arrays may take any shape known in the art, and may include multiple species of center wavelengths. UV LED embodiments are not limited to any particular technology, however. While discussed in terms of UV radiation and UV sources, it should also be understood that for photopolymers cured by radiation in other wavelength ranges, the actinic radiation may be in whatever range required to cure the photopolymer, and the radiation may be created by any technology known in the art, not limited to LED technology.

Figure 7A:
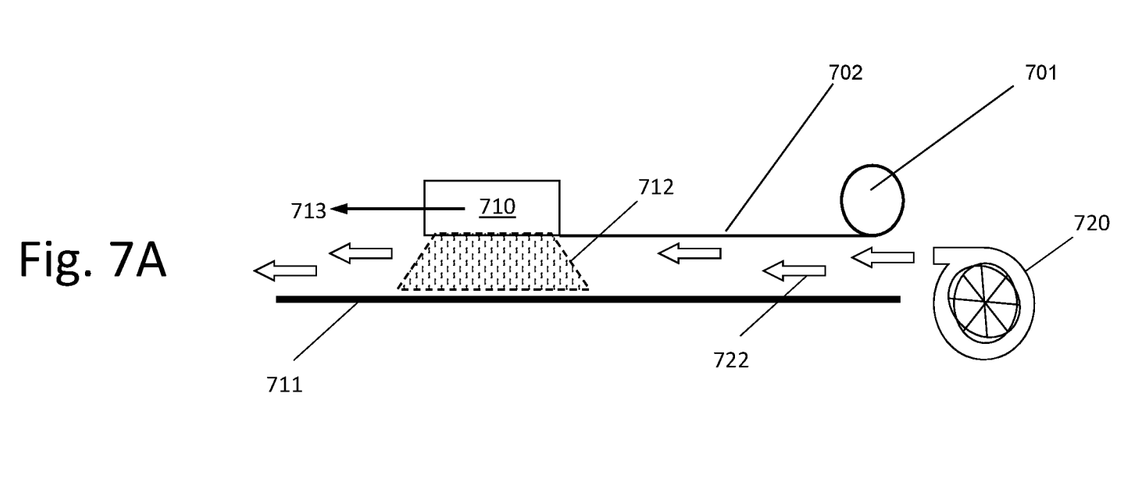
FIG. 7A is a schematic side view drawing depicting an exemplary exposure system having an air handler fixed in a position adjacent one end of the substrate, with a foil or curtain having one end attached to the source and an opposite end attached to a roller disposed adjacent the air outlet for containing the airflow between the air outlet and the trailing edge of the source.
Figure 7B:
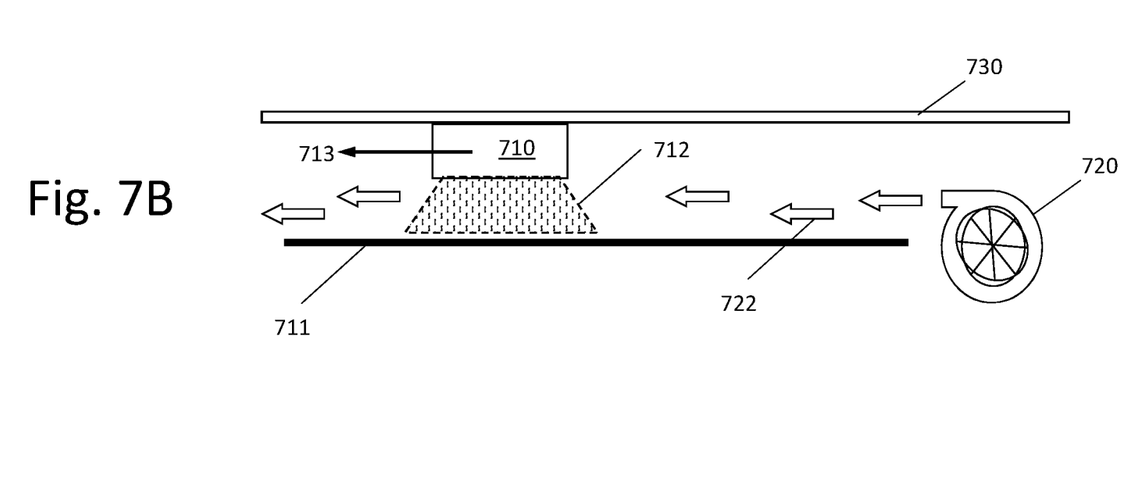
FIG. 7B is a schematic side view drawing depicting an exemplary exposure system having an air handler fixed in a position adjacent one end of the substrate, with a cover spaced apart from the substrate for containing the airflow.

Although discussed primarily herein with respect to systems in which the cooling air system includes an outlet attached to the radiation source, embodiments of the invention may include embodiments, e.g., flatbed systems, in which the cooling air system is not attached to the radiation source, and the cooling air instead travels from one end of the flatbed to the other in a fixed arrangement that does not move with the radiation source. An exemplary system is depicted in FIGS. 7A and 7B. As depicted in FIG. 7B, blower 720 provides air in the direction of arrows 722 while the source 710 emits radiation 712 during travel in the direction of arrow 713, thus cooling from trailing edge to leading edge. In the embodiment depicted in FIG. 7B, the cooling air is contained between cover 730 and plate 711. Although only a top of the cover 730 is depicted, which cover may be openable relative to the substrate on which the printing plate is disposed, it should be understood that the cover may include additional side portions that create a relatively airtight enclosure that focuses the air in a path that moves across the plate. The air is supplied into that enclosure adjacent one end of the substrate, and exits the enclosure adjacent the opposite end of the substrate. The air may be blown from the air supply end, or pulled through a vent by suction applied from the opposite end. As used herein, the term "air outlet" refers to the location where air enters the gap between the source and the plate, whether it is an actual outlet of an air handling system or an inlet point where air enters from outside the enclosure pulled in by a source of vacuum.

A fixed cooling air system originating from one end of the flatbed and not attached to the moving UV head may generally be less effective than a system with an outlet attached to the head. Moreover, the cooling effect may vary depending on how far the UV Head is away from the cooling air supply during movement. Improved air focus in such systems may be provided by using an additional air guiding foil or curtain 702, which may be disposed on a roller 701 that is spring biased (i.e. such as a roller shade for a window) such that the force of the source traveling away from the roller unspools the foil or curtain from the roller, and the roller automatically rewinds the foil on the roll to take up slack as the travel of the source resumes toward the roller. Systems with such a foil or curtain may be particularly useful in open systems (having no cover), or may also be used inside systems with a cover for greater focus.

Systems with cooling air systems fixed to the substrate for holding the plate may also be configured to provide airflow always from the trailing edge for exposure by the source traveling in either direction using configurations similar to those described herein with respect to FIGS. 6A-6C, wherein instead of having the respective air outlets connected to the radiation source, they are positioned on opposite sides of the substrate that holds the printing plate. Thus, in one embodiment, akin to FIG. 6B, but with the air handler(s) 633 disposed on one end of substrate 636 (e.g. a flatbed) instead of source 634, the controller can change the direction of rotation the air handlers(s) based upon movement direction of the source. In other embodiments, with a first set of air handlers (e.g. 602 in FIG. 6A mounted to substrate 606 instead of source 604) or a first manifold (e.g. 681 mounted to substrate 676 instead of source 674 in FIG. 6C) on each side of the flatbed and a second set of set of air handlers (e.g. 603 in FIG. 6A mounted on the right end of substrate 606 instead of source 604) or a second manifold on the other side of the flatbed (e.g. 682 mounted to substrate 676 instead of source 674 in FIG. 6C), the controller can activate and deactivate the respective air handlers or control the respective valve 684 to ensure airflow always moves from the trailing edge to the leading edge. In systems with a foil or curtain, one foil or curtain may be attached to one edge of the source and spooled on a first roller disposed at the like end of the substrate, and another foil or curtain may be attached to the opposite edge of the source and spooled on a roller disposed at the opposite end of the substrate. In embodiments with multiple foils or curtains, one or both of the foils or curtains may be attachable and detachable, to permit easier placement of the plate on the substrate.

EXAMPLES

A test embodiment was equipped with nine EBM Papst 8414NH 80×80×25 mm fans powered by a 24V DC supply. Each fan had a maximum power consumption of 2.4 Watts and generated a free-blowing air volume of 79 $m^3/h$. The air volume was adjustable by electronic control of the fan rotation speed.

The arrangement used for the test was consistent with the embodiment depicted FIG. 2 and FIG. 3. The fans were mounted in a housing having particle filters at the air inlet to prevent dust or other airborne particles to be blown onto the surface of the printing plate. Due to the flow resistance of the filter and the air guidance of the housing, the actual air volume was significantly lower than the free-blowing rating of 79 $m^2/h$ for each fan, and although not fully quantified, believed to be at a volume of a few tens of (e.g. in a range of 20-40) $m^3/h$ for the entire unit. The actual volume was further reduced by reducing the fan speed.

Figure 4A:
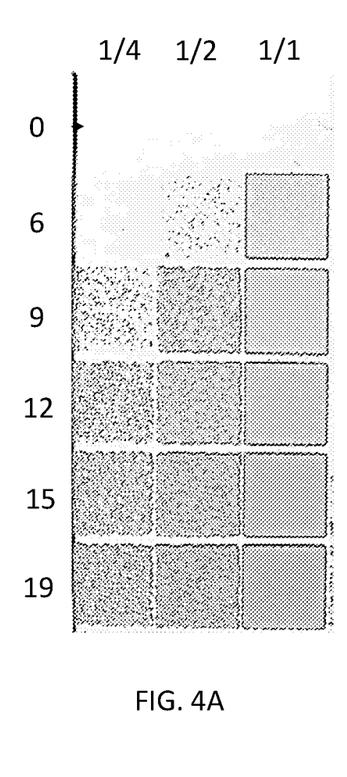
FIG. 4A is a photograph showing the relevant fields of a dotfail test result on a plate exposed with cooling air blowing from the leading edge toward the trailing edge of the radiation source.
Figure 4B:
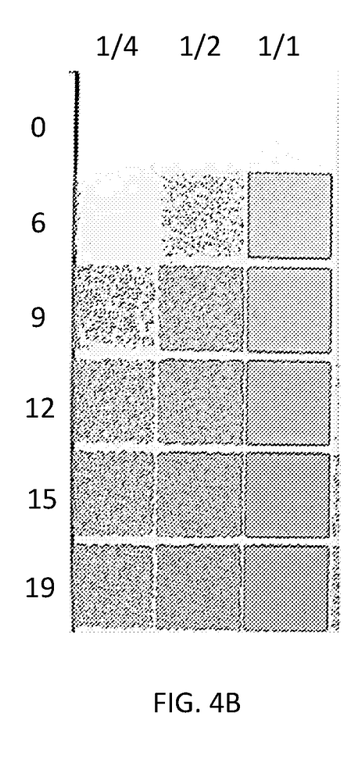
FIG. 4B is a photograph showing the relevant fields of a dotfail test result on a plate exposed with cooling air blowing from the trailing edge toward the leading edge of the radiation source in accordance with an embodiment of the invention.
Figure 4C:
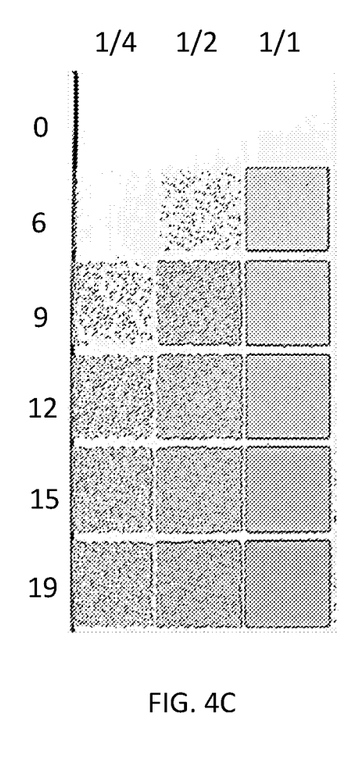
FIG. 4C is a photograph showing the relevant fields of a dotfail test result on a plate exposed without the use of cooling air.

FIGS. 4A-C show three samples of a so-called "dotfail test" conducted on a DuPont DPR 045 photopolymer plate. A "dotfail test" comprises a series of test fields comprising different sized printing dots with different densities of dots. From bottom to top, the dots get increasingly smaller, from left to right, the density of dots inside the test field increases. As is understood by those of skill in the art, the labelling of the rows of fields in the dotfail test results corresponds to the number of pixels that form a screen dot in the corresponding field. Thus, each dot in the fields corresponding to row "6" comprises six "on" pixels in the corresponding screen that are imaged to form the openings in the mask through which the radiation passes to expose the photopolymer. The labelling of the columns of fields in the dotfail test results correspond to the degree to which the corresponding screen transitions from an AM screen to an FM screen by removal of dots. Thus, "1/1" means all dots in the screen pattern are imaged; "½" means 50% of the dots in the screen pattern are imaged, with 50% of the dots having been removed; "¼" means 25% of the dots in the screen pattern are imaged, with 75% of the dots having been removed.

The sample of FIG. 4A shows the exposure result for a set of exposure conditions with the fan unit blowing cooling air from the leading-edge side of the UV head. The sample of FIG. 4B shows the exposure result for the same set of exposure conditions as used for generating the sample of FIG. 4A, but with the fan unit blowing cooling air from the trailing edge side of the UV head. The sample of FIG. 4C shows the exposure result for the same set of exposure conditions as used for generating the samples of FIGS. 4A and 4B, but without any cooling air. The differences illustrating the advantages of aspects of the invention are most evident in the field corresponding to row "6" in column "½", in which the sample of FIG. 4B, generated with cooling air blowing from the trailing edge, holds the most dots of the three like fields for the test results illustrated in FIGS. 4A-4C.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for curing a photopolymer printing plate curable by exposure to actinic radiation, the system comprising:
   a substrate for receiving the photopolymer printing plate disposed thereon;
   a source of actinic radiation spaced from the substrate a distance sufficient to define a gap between the source of actinic radiation and the printing plate disposed on the substrate, the source of actinic radiation operable to direct actinic radiation toward the substrate;
   means for providing relative motion between the source of actinic radiation and the substrate in a movement direction that defines a leading edge of the source of actinic radiation and a trailing edge of the source of actinic radiation relative to the movement direction; and
   a cooling air handling system configured to direct a volume of cooling air into the gap with the cooling air moving only in a direction from the trailing edge to the leading edge.

2. The system of claim 1, wherein volume of moving cooling air is controllable.

3. The system of claim 1, wherein the source of actinic radiation comprises one or more UV LED sources.

4. The system of claim 3, wherein the one or more UV LED sources has a radiation-emitting lateral dimension in the movement direction in a range 10-60 cm.

5. The system of claim 1, wherein the air handling system comprises one or more fans, the one or more fans has an air intake, and an air filter is disposed in the air intake.

6. The system of claim 1, wherein the air handling system comprises a duct connected to a manifold disposed to direct the moving cooling air into the gap.

7. The system of claim 1, wherein the air handling system is connected to a source of compressed air for generating the volume of cooling air.

8. The system of claim 1, wherein the air handling system further comprises a heat exchanger configured to reduce temperature of airflow.

9. The system of claim 8, wherein the heat exchanger is a water-cooled heat exchanger, the system further comprises a source of water connected to the heat exchanger, and the source of water comprises a same source of water that feeds a cooling system for cooling the source of actinic radiation.

10. The system of claim 1, further comprising a controller configured to control the relative motion between the source of actinic radiation and the substrate, wherein the system is configured to emit actinic radiation in a first relative movement direction and in a second relative movement direction opposite the first relative movement direction, and the controller is configured to change the direction of the moving cooling air in coordination with the movement direction so that the cooling air travels from the trailing edge to the leading edge in both the first movement direction and the second movement direction.

11. The system of claim 1, wherein the air handling system comprises a first set of one or more fans positioned to discharge air from a first side of the source of actinic radiation and second set of one or more fans positioned to discharge air from a second side of the source of actinic radiation, and a controller is configured to activate the first set of one or more fans and deactivate the second set of one or more fans when the trailing edge is on the first side and to activate the second set of fans and deactivate the first set of fans when the trailing edge is on the second side.

12. The system of claim 1, wherein the air handling system comprises a single set of one or more fans connected to a duct connected to a manifold disposed to direct the moving cooling air, and a controller is configured to control a rotation direction of the single set of one or more fans so that the manifold serves as either a discharge of air or an intake of air based upon the movement direction, so that the cooling air travels from the trailing edge to the leading edge in both the first movement direction and the second movement direction.

13. The system of claim 1, wherein the air handling system comprises a first manifold positioned to discharge air from a first side of the source of actinic radiation and a second manifold positioned to discharge air from a second side of the source of actinic radiation, with a valve disposed in a duct upstream of the first manifold and the second manifold, the valve having a first position in which air flows only to the first manifold and a second position in which air flows only to the second manifold, a controller configured to cause the valve to be in the first position when the trailing edge is on the first side and to cause the valve to be in the second position when the trailing edge is on the second side.

14. The system of claim 1, wherein the cooling air handling system comprises one or more air outlets attached to the source of actinic radiation and the one or more air outlets is configured to direct the volume of moving cooling air at an angle of less than 45 degrees relative to a planar surface defined by the printing plate.

15. The system of claim 1, wherein the cooling air handling system comprises one or more air outlets fixed at one end or both ends of the substrate for receiving the photopolymer printing plate.

16. The system of claim 1, further comprising a cover spaced apart from the substrate, wherein the source of actinic radiation and the plate are disposed between the substrate and the cover.

17. The system of claim 15, further comprising at least one foil or curtain, each having one end attached to the source of actinic radiation, and an opposite end attached to a roller positioned adjacent the one or more air outlets, wherein the at least one foil or curtain is configured to contain the cooling air between the substrate and the at least one foil or curtain from the one or more air outlets to the trailing edge of the source of actinic radiation, and wherein the roller is spring biased toward spooling of the at least one foil or curtain on the roll.

18. A system for curing a photopolymer printing plate curable by exposure to actinic radiation, the system comprising:
   a substrate for receiving the photopolymer printing plate disposed thereon;
   a source of actinic radiation spaced from the substrate a distance sufficient to define a gap between the source of actinic radiation and the printing plate disposed on the substrate, the source of actinic radiation operable to direct actinic radiation toward the substrate;

means for providing relative motion between the source of actinic radiation and the substrate in a movement direction that defines a leading edge of the source of actinic radiation and a trailing edge of the source of actinic radiation relative to the movement direction; and a cooling air handling system having an outlet attached to the source of actinic radiation and configured to direct a volume of cooling air into the gap with the cooling air moving in a direction from the trailing edge to the leading edge.

\* \* \* \* \*